United States Patent
Lien et al.

(10) Patent No.: US 6,470,418 B1
(45) Date of Patent: Oct. 22, 2002

(54) PIPELINING A CONTENT ADDRESSABLE MEMORY CELL ARRAY FOR LOW-POWER OPERATION

(75) Inventors: Chuen-Der Lien, Los Altos Hills; Chau-Chin Wu, Cupertino; John R. Mick, San Jose, all of CA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 0 days.

(21) Appl. No.: 09/232,413

(22) Filed: Jan. 15, 1999

(51) Int. Cl.[7] .............................................. G06F 12/00
(52) U.S. Cl. ........................ 711/108; 711/168; 365/49
(58) Field of Search ................................. 711/108, 169; 365/49

(56) References Cited

U.S. PATENT DOCUMENTS 5,555,397 A * 9/1996 Sasama et al. ............... 711/158
5,619,446 A * 4/1997 Yoneda et al. ................. 365/49
5,813,040 A * 9/1998 Rathke ........................ 711/156

* cited by examiner

*Primary Examiner*—Matthew Kim
*Assistant Examiner*—Matthew D. Anderson
(74) *Attorney, Agent, or Firm*—Bever, Hoffman & Harms LLP

(57) ABSTRACT

A content addressable memory (CAM) system that includes first and second CAM arrays, which generate first and second sets of match control signals, respectively, having higher and lower priorities, respectively. The first CAM array is enabled during a first memory cycle, and the first set of match control signals are analyzed. If a match exists in the first CAM array, a first priority encoder is enabled to process the first set of match control signals. If no match exists, the first priority encoder is not enabled, and a second memory cycle is initiated. The second CAM array is enabled during the second memory cycle, and the second set of signals is analyzed. If a match exists in the second CAM array, a second priority encoder is enabled to process the second set of match control signals. If no match exists, the second priority encoder is not enabled.

29 Claims, 11 Drawing Sheets

US 6,470,418 B1

PIPELINING A CONTENT ADDRESSABLE MEMORY CELL ARRAY FOR LOW-POWER OPERATION

BACKGROUND OF THE INVENTION

1. Field of the Invention

The present invention relates to content addressable memory (CAM) cells. More specifically, the present invention relates to methods and structures for pipelining an array of CAM cells.

2. Discussion of Related Art

CAM cells are defined as memory cells that are addressed in response to their content, rather than by a physical address within an array. FIG. 1 is a block diagram of a conventional memory array formed using twelve CAM cells. The CAM cells are labeled $M_{X,Y}$, where X is the row of the array, and Y is the column of the array. Thus, the array includes CAM cells $M_{0,0}$ to $M_{2,3}$. Each of the CAM cells is programmed to store a data bit value. In the described example, the data bit value stored in each CAM cell is indicated by either a "0" or a "1" in brackets. For example, CAM cells $M_{0,0}$, $M_{0,2}$ and $M_{0,3}$ store data bit values of 0, 1, 0 and 0, respectively. Each row of CAM cells is coupled to a common match line. For example, CAM cells $M_{0,0}$, $M_{0,1}$, $M_{0,2}$ and $M_{0,3}$ are coupled to match line $MATCH_0$.

The array of CAM cells is addressed by providing a data bit value to each column of CAM cells. Thus data bit values $D_0$, $D_1$, $D_2$ and $D_3$ are provided to columns 0, 1, 2 and 3, respectively. Note that complementary data bit values $D_0\#$, $D_1\#$, $D_2\#$ and $D_3\#$ are also provided to columns 0, 1, 2 and 3, respectively. If the data bit values stored in a row of the CAM cells match the applied data bit values $D_0$–$D_3$, then a match condition occurs. For example, if the data bit values $D_0$, $D_1$, $D_2$ and $D_3$ are 0, 1, 0 and 0, respectively, then the data bit values stored in the CAM cells of row 0 match the applied data bit values. Under these conditions, the $MATCH_0$ signal is asserted true (e.g., high). Because the applied data bit values $D_0$, $D_1$, $D_2$ and $D_3$ do not match the data bit values store in the CAM cells of rows 1 or 2, the $MATCH_1$ and $MATCH_2$ signals are de-asserted false (e.g., low). The match signals $MATCH_0$–$MATCH_2$ can be used for various purposes, such as implementing virtual addressing, in a manner known to those skilled in the art.

FIG. 2 is a block diagram of a conventional CAM system 1 that includes a 64 Kbit CAM array 10 and an associated priority encoder 11. CAM array 10 includes 1024 rows and 64 columns of CAM cells. A 64-bit data input signal D[63:0] is provided from an input/output (I/O) circuit (not shown) to CAM array 10. Each row of CAM cells in CAM array 10 simultaneously compares its contents with the input data signal D[63:0] in the manner described above in connection with FIG. 1. If a match is detected in any of the rows, CAM array 10 asserts a corresponding match control signal. More specifically, if a match is detected in row N of CAM array 10, then match control signal MATCH_N is asserted, where N is an integer between 0 and 1023.

More than one of the match control signals can be asserted during a comparison operation. For example, match control signals MATCH_1, MATCH_125 and MATCH_1000 may be asserted during the same comparison operation. All of the match control signals are provided to priority encoder 11. Priority encoder 11 determines which one of the asserted match control signals has priority. In response, priority encoder 11 provides a 10-bit output address A[9:0] that corresponds with the asserted match control signal determined to have priority. The output address A[9:0] is provided to the I/O circuitry (not shown).

FIG. 3 is a block diagram of a 1 Mbit CAM system 100 that includes sixteen CAM arrays 101–116 identical to CAM array 10 (FIG. 2). Each of the sixteen CAM arrays 101–116 receives the input data signal D[63:0] and simultaneously generates the appropriate match control signals. Priority encoder 120 receives the match control signals from all of the CAM arrays 101–116. In response, priority encoder 120 generates a 14-bit output address A[13:0].

CAM system 100 consumes a significant amount of power. In general, CAM arrays 101–116 consume about 2.5 Watts. Priority encoder 120 also typically consumes about 2.5 Watts. The I/O circuitry associated with CAM system 100 consumes about 1 Watt. This is a significant amount of power to be consumed by a memory system. Consequently, CAM arrays are typically limited to smaller capacities than 1 Mbit (e.g., 1 Kbit).

It would therefore be desirable to have a CAM system having a relatively large capacity, but which consumes less power than a conventional CAM system having the same capacity.

Accordingly, the present invention provides a CAM system that includes a first CAM array and a second CAM array. The first CAM array is coupled to a first match detector and a first priority encoder. The second CAM array is coupled to a second match detector and a second priority encoder. The first CAM array generates a first set of match control signals, and the second CAM array generates a second set of match control signals. The match control signals in the first set have priority over the match control signals in the second set.

During a first memory cycle, the first CAM array is enabled and the second CAM array is disabled. At this time, the first CAM array generates the first set of match control signals in response to an input data value. The first match detector receives the first set of match control signals, and in response, determines whether a match exists in the first CAM array. If a match exists in the first CAM array, the first priority encoder is enabled to process the first set of match control signals. Under these conditions, power savings are realized because it is not necessary to enable either the second CAM array or the second priority encoder.

If a match does not exist in the first CAM array, the first priority encoder is not enabled, and a second memory cycle is initiated. During the second memory cycle, the second CAM array is enabled and the first CAM array is disabled. At this time, the second CAM array generates the second set of match control signals in response to the input data value. The second match detector receives the second set of match control signals, and in response, determines whether a match exists in the second CAM array. If a match exists in the second CAM array, the second priority encoder is enabled to process the second set of match control signals. Under these conditions, power savings are realized because it is not necessary to enable the first priority encoder.

If a match does not exist in the second CAM array, then the second priority encoder is not enabled. Under these conditions, power savings are realized because it is not necessary to enable the first priority encoder or the second priority encoder.

In a variation of the above-described embodiment of the present invention, the first match detector can be divided into a plurality of smaller match detectors, and the first priority encoder can be divided into a corresponding plurality of smaller priority encoders. In this variation, additional power savings are realized within the first priority encoder, because only one of the smaller priority encoders is enabled when there is a match in the first CAM array.

In a second embodiment of the present invention, the first priority encoder can be divided into a first-level priority encoder and a second-level priority encoder. The first-level priority encoder is coupled to receive the first set of match control signals, and reduce these match control signals down to a second set of match control signals. The first match detector is coupled to receive the second set of match control signals, and in response, determine whether a match exists in the first CAM array. If the first match detector determines that a match exists in the first CAM array, then the second-level priority encoder is enabled to process the second set of match control signals. If the first match detector determines that no match exists in the first CAM array, then the second-level priority encoder is disabled. In this embodiment, the first match detector circuit advantageously operates on fewer match control signals. However the power savings is limited to the second-level priority encoder, because the first-level priority encoder must be enabled for every comparison operation.

In a first variation of the second embodiment, the first match detector is divided into a plurality of smaller match detectors, and the second-level priority encoder is divided into a corresponding plurality of smaller second-level priority encoders. In this variation, additional power savings are realized within the second-level priority encoder, because only one of the smaller second-level priority encoders is enabled when there is a match in the first CAM array.

In a second variation of the second embodiment, the first match detector is divided into a plurality of smaller match detectors. Each of these smaller match detectors is coupled to a multiplexer which feeds a second-level priority encoder that only has the capacity to process the match control signals associated with one of the smaller match detectors. When a match is detected by one or more of the smaller match detectors, the multiplexer routes the match control signals associated with the match detector having the highest priority to the second level priority encoder for further processing. This variation advantageously enables a smaller second-level priority encoder to be used.

The present invention will be more fully understood in view of the following description and drawings.

DETAILED DESCRIPTION

Figure 1:
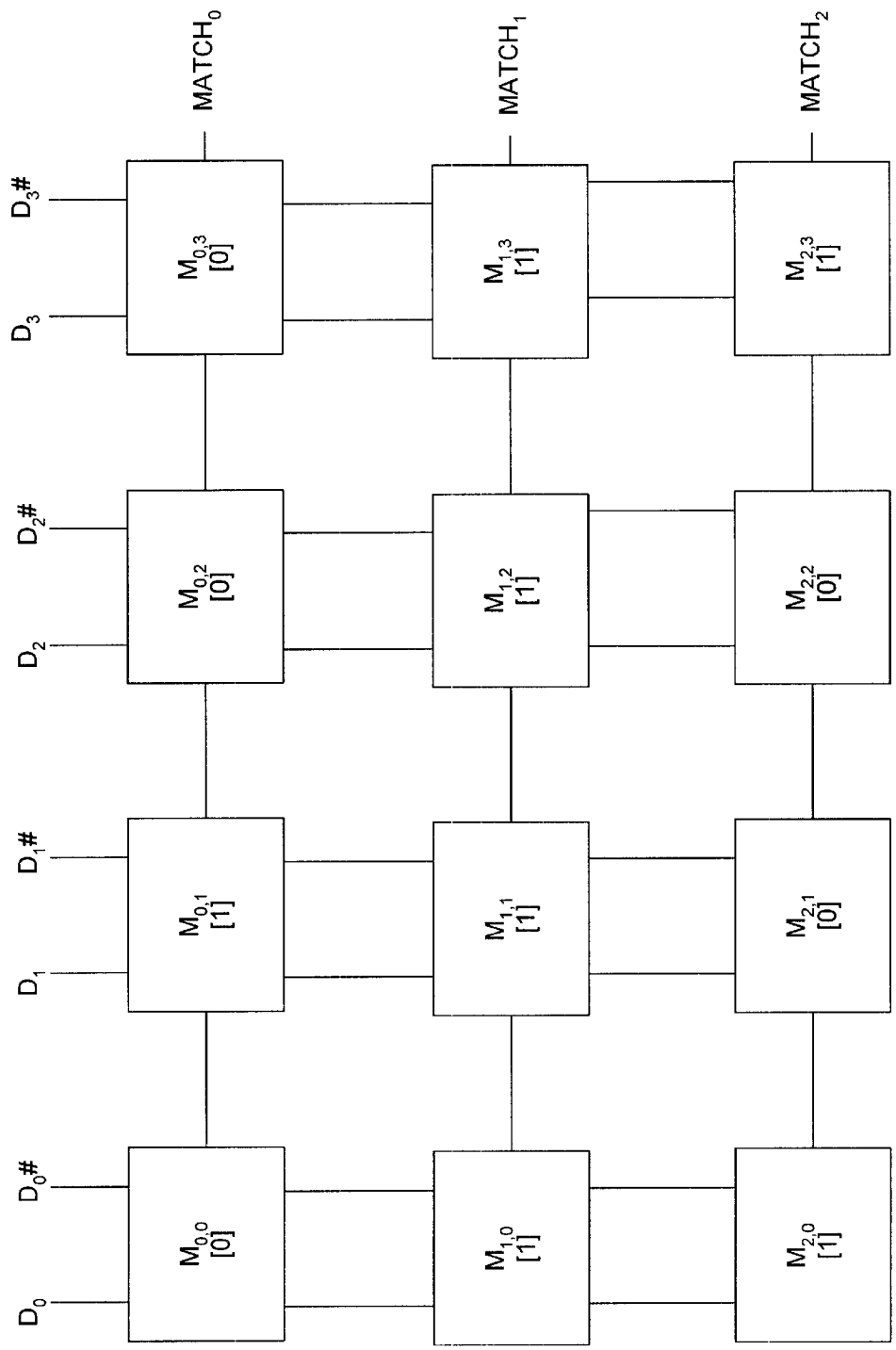
FIG. 1 is a block diagram of a conventional array of CAM cells.
Figure 2:
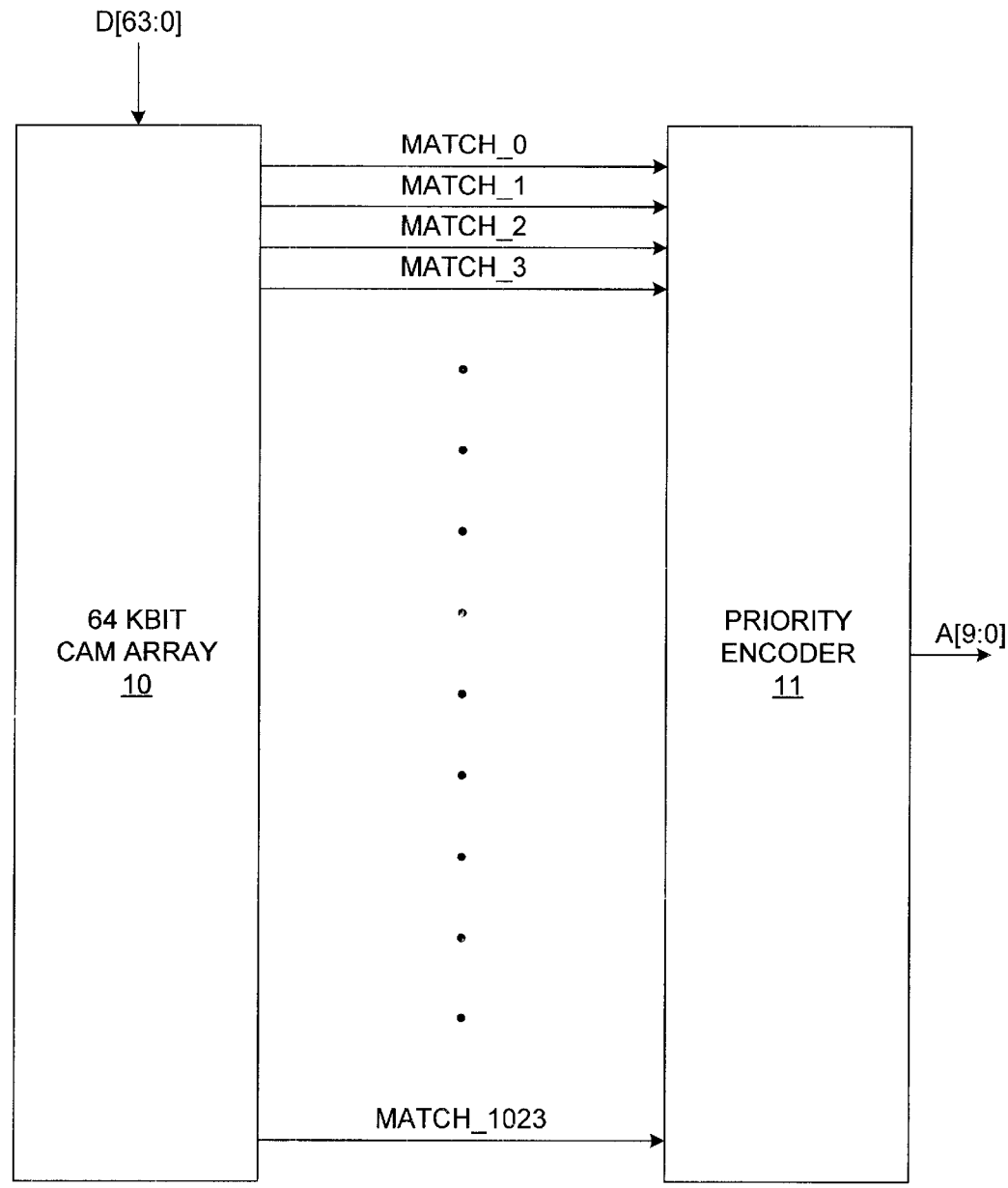
FIG. 2 is a block diagram of a conventional 64-Kbit CAM system.
Figure 3:
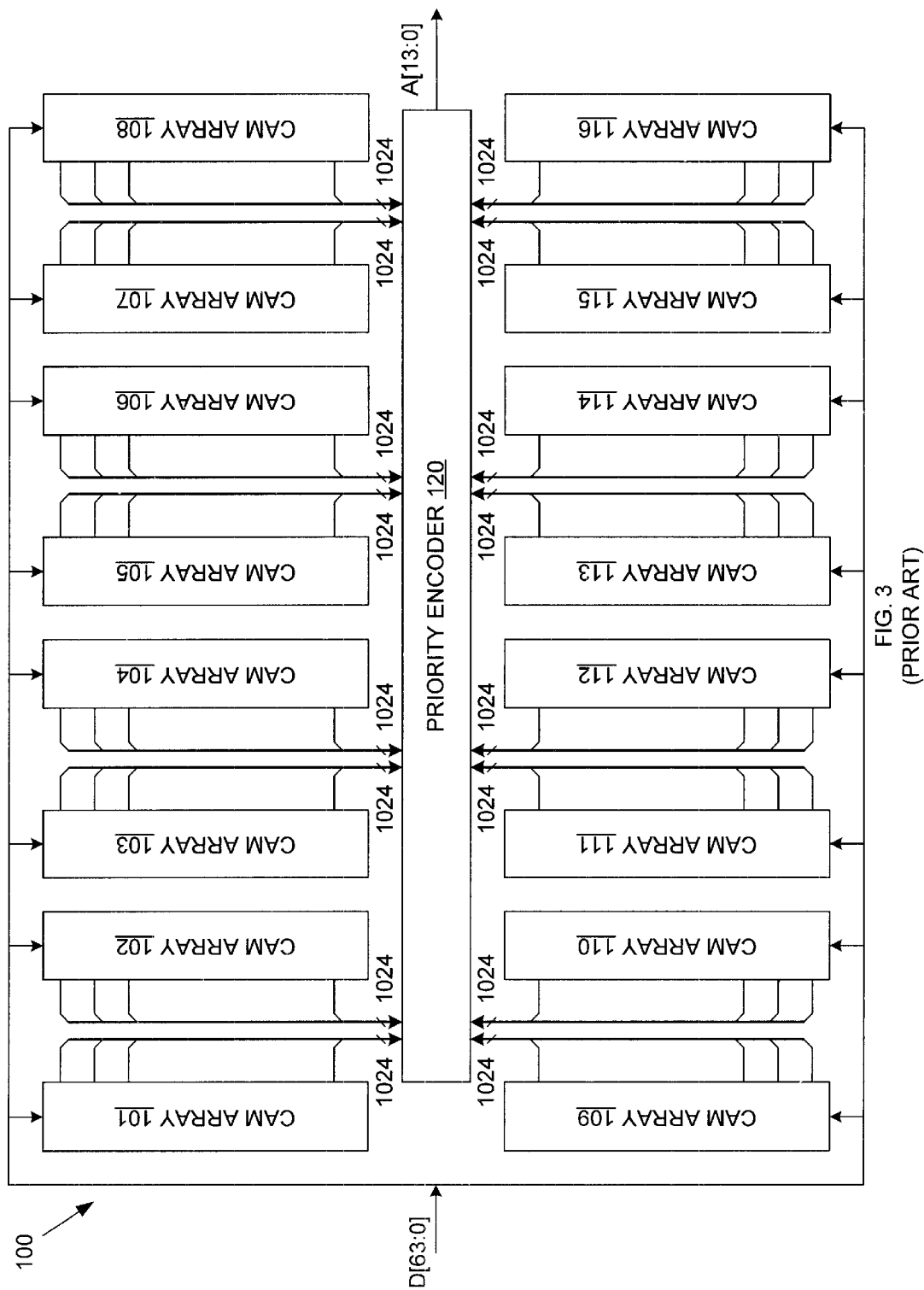
FIG. 3 is a block diagram of a conventional 1-Mbit CAM system.
Figure 4:
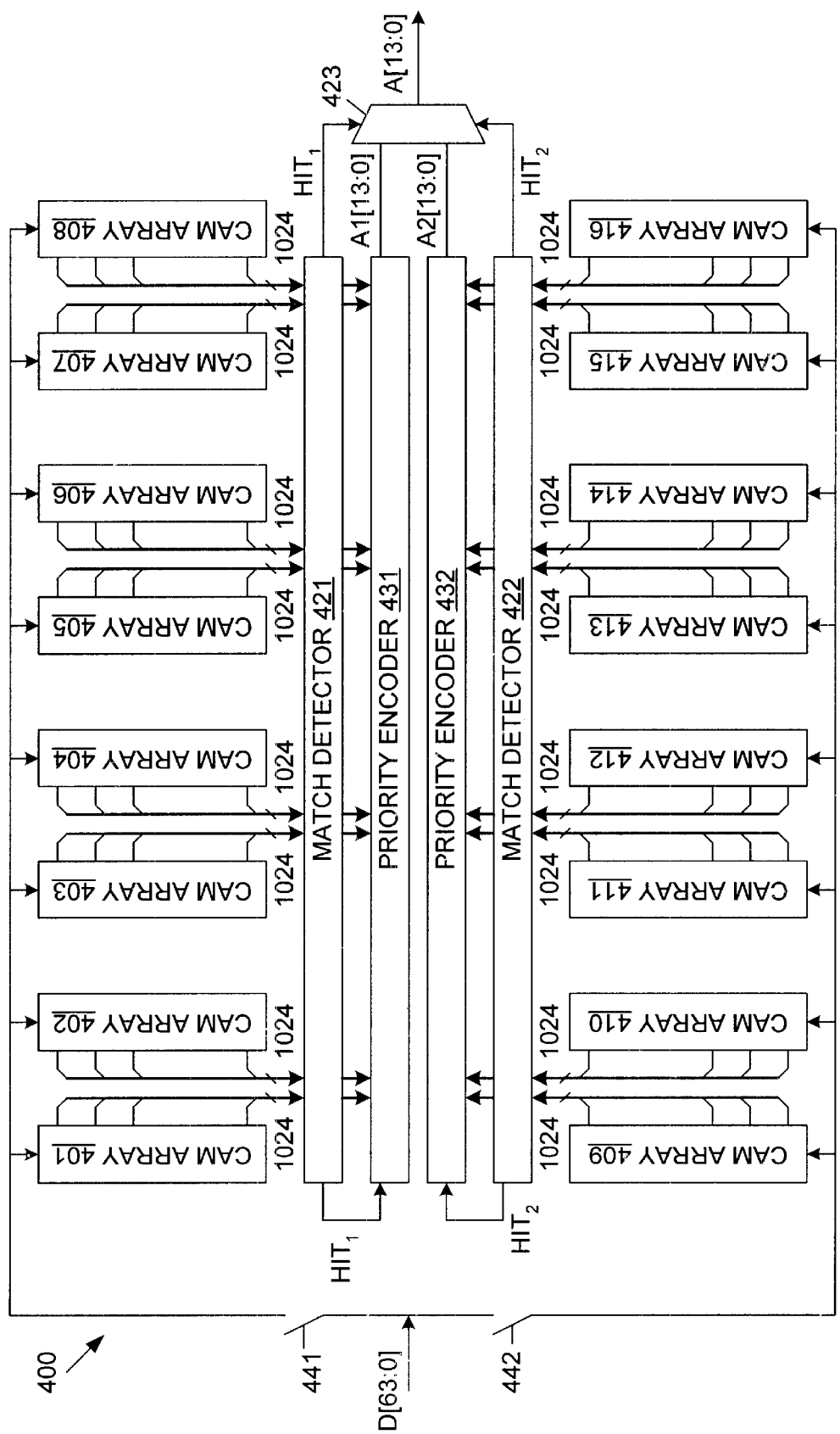
FIG. 4 is a block diagram of a 1-Mbit CAM system in accordance with one embodiment of the present invention.

FIG. 4 is a block diagram of a 1-Mbit CAM system 400 in accordance with one embodiment of the present invention. CAM system 400 includes sixteen CAM arrays 401–416. Each of these CAM arrays 401–416 is identical to conventional CAM array 10. Thus, each of CAM arrays 401–416 has 64 columns and 1024 rows of CAM cells. CAM system 400 therefore has a capacity of 1 Mbit. It is noted that the present invention is not limited to a CAM system having a particular capacity. Similarly, the present invention is not limited to a CAM system having a particular number of CAM arrays, or to a CAM system using CAM arrays having particular row/column dimensions.

Each of CAM arrays 401–416 is coupled to receive a 64-bit input data value D[63:0]. Each row of CAM cells in each CAM array compares its contents with the input data value D[63:0]. If a match is detected in any of the rows, the associated CAM array asserts a corresponding match control signal. More specifically, if a match is detected in row N of CAM array M, then CAM array M asserts match control signal MATCH_N, where N is an integer between 0 and 1023 and M is an integer between 401 and 416. More than one match can be detected during a single comparison operation. For example, during one comparison operation, two matches can exist in CAM array 401, one match can exist in CAM array 406, and one match can exist in CAM array 414.

CAM arrays 401–416 are divided into a first set of CAM arrays 401–408 and a second set of CAM arrays 409–416. The first set of CAM arrays 401–408 is designated to have a higher priority than the second set of CAM arrays 409–416. That is, every match control signal generated by the first set of CAM arrays 401–408 has a higher priority than any match control signal generated by the second set of CAM arrays 409–416.

CAM system 400 further includes first match detector 421, first priority encoder 431, second match detector 422 and second priority encoder 432. First match detector 421 and first priority encoder 431 are coupled to receive the match control signals generated by the first set of CAM arrays 401–408. Second match detector 422 and second priority encoder 432 are coupled to receive the match control signals generated by the second set of CAM arrays 409–416.

CAM system 400 operates as follows. During a first memory cycle, switch 441 is closed and switch 442 is opened, thereby transmitting input data value D[63:0] to the first set of CAM arrays 401–408. Each of CAM arrays 401–408 simultaneously performs a comparison operation, wherein each row in CAM arrays 401–408 compares its contents with the input data value D[63:0]. A logic high match control signal is asserted for each match detected within the first set of CAM arrays 401–408.

First match detector 421 is coupled to receive all of the match control signals from CAM arrays 401–408. First match detector 421 makes an initial determination as to whether any match exists in any one of CAM arrays 401–408. If first match detector 421 does not detect a match, then first priority encoder 431 is not enabled. Conversely, if first match detector 421 detects a match, then first priority encoder 431 is enabled.

Figure 5A:
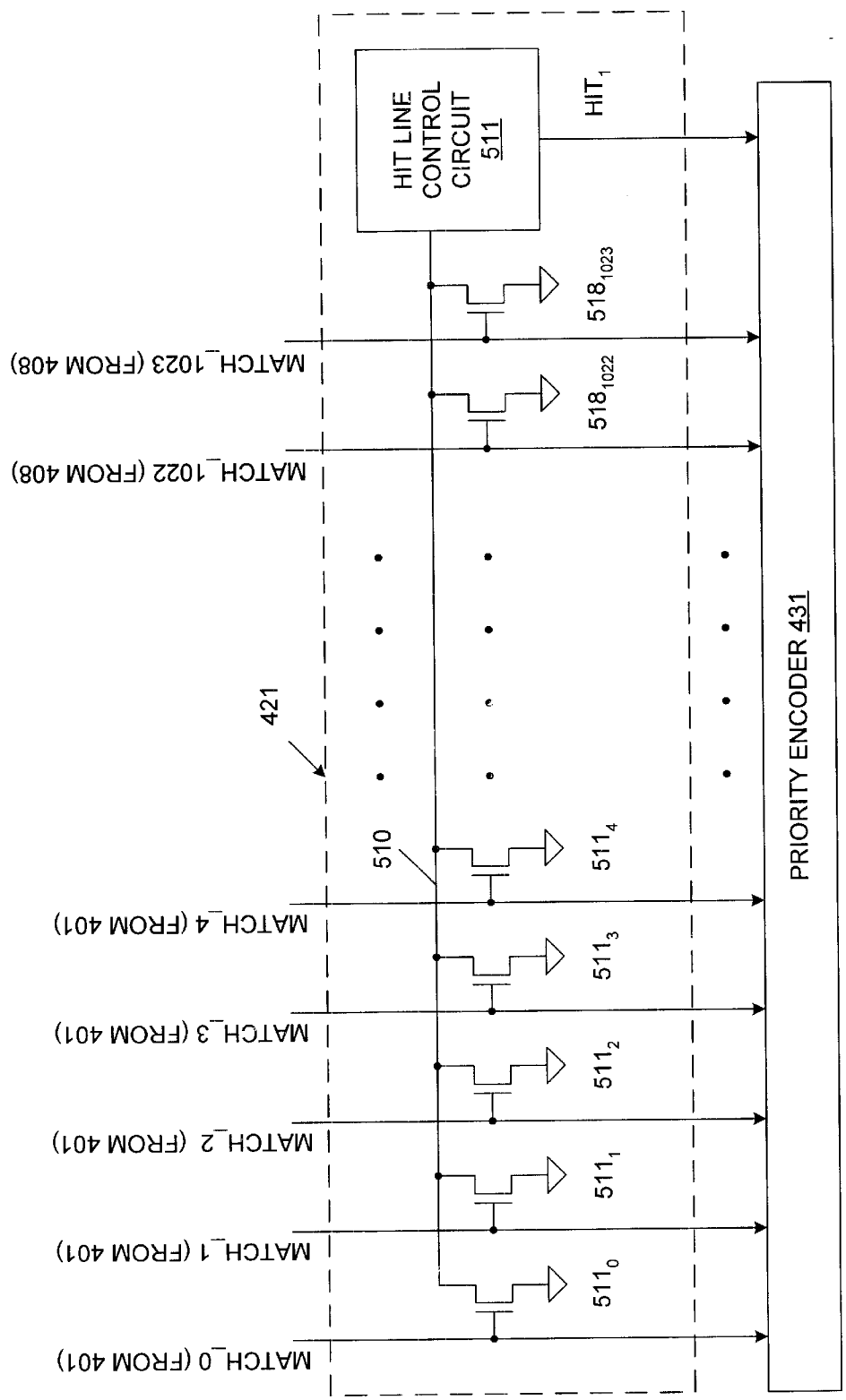
FIG. 5A is a schematic diagram illustrating a match detector in accordance with one embodiment of the present invention.

FIG. 5A is a schematic diagram illustrating first match detector 421 in accordance with one embodiment of the present invention. First match detector 421 includes hit line 510, hit line control circuit 511, and a plurality of n-channel pass transistors $501_0$–$501_{1023}$, $502_0$–$502_{1023}$ $503_0$–$503_{1023}$, $504_0$–$504_{1023}$, $505_0$–$505_{1023}$, $506_0$–$506_{1023}$, $507_0$–$507_{1023}$, and $508_0$–$508_{1023}$, which are coupled to receive the match control signals from CAM arrays 401, 402, 403, 404, 405, 406, 407 and 408, respectively. Only pass transistors $501_0$–$501_4$ and $508_{1022}$–$508_{1023}$ are illustrated in FIG. 5 for purposes of clarity.

Each pass transistor in first match detector 421 is coupled in series between hit line 510 and a ground supply terminal. The gate of each pass transistor is coupled to receive a corresponding match control signal from a corresponding row of CAM cells. For example, the gate of pass transistor $501_4$ is coupled to receive match control signal MATCH_4 from row 4 of CAM array 401.

At the beginning of the first memory cycle, hit line control circuit 511 pre-charges hit line 510 to a logic high voltage. If at least one of the match control signals provided by the first set of CAM arrays 401–408 is asserted high, then an associated one of the pass transistors in first match detector 421 is turned on, thereby pulling down hit line 510 to a logic low value. Hit line control circuit 511 monitors the voltage on hit line 510. If the voltage on hit line 510 is pulled down to a logic low value, then hit line control circuit 511 asserts a logic high hit control signal $HIT_1$. A logic high hit control signal $HIT_1$ therefore indicates the presence of at least one match in the first set of CAM arrays 401–408.

If none of the match control signals provided by the first set of CAM arrays 401–408 is asserted high (i.e., no match is detected), then none of the pass transistors in first match detector 421 is turned on. As a result, hit line 510 maintains its logic high state. Upon detecting the logic high state on hit line 510, hit line control circuit 511 de-asserts the hit control signal $HIT_1$ low. A logic low hit control signal $HIT_1$ therefore indicates the absence of any matches in the first set of CAM arrays 401–408.

Figure 5B:
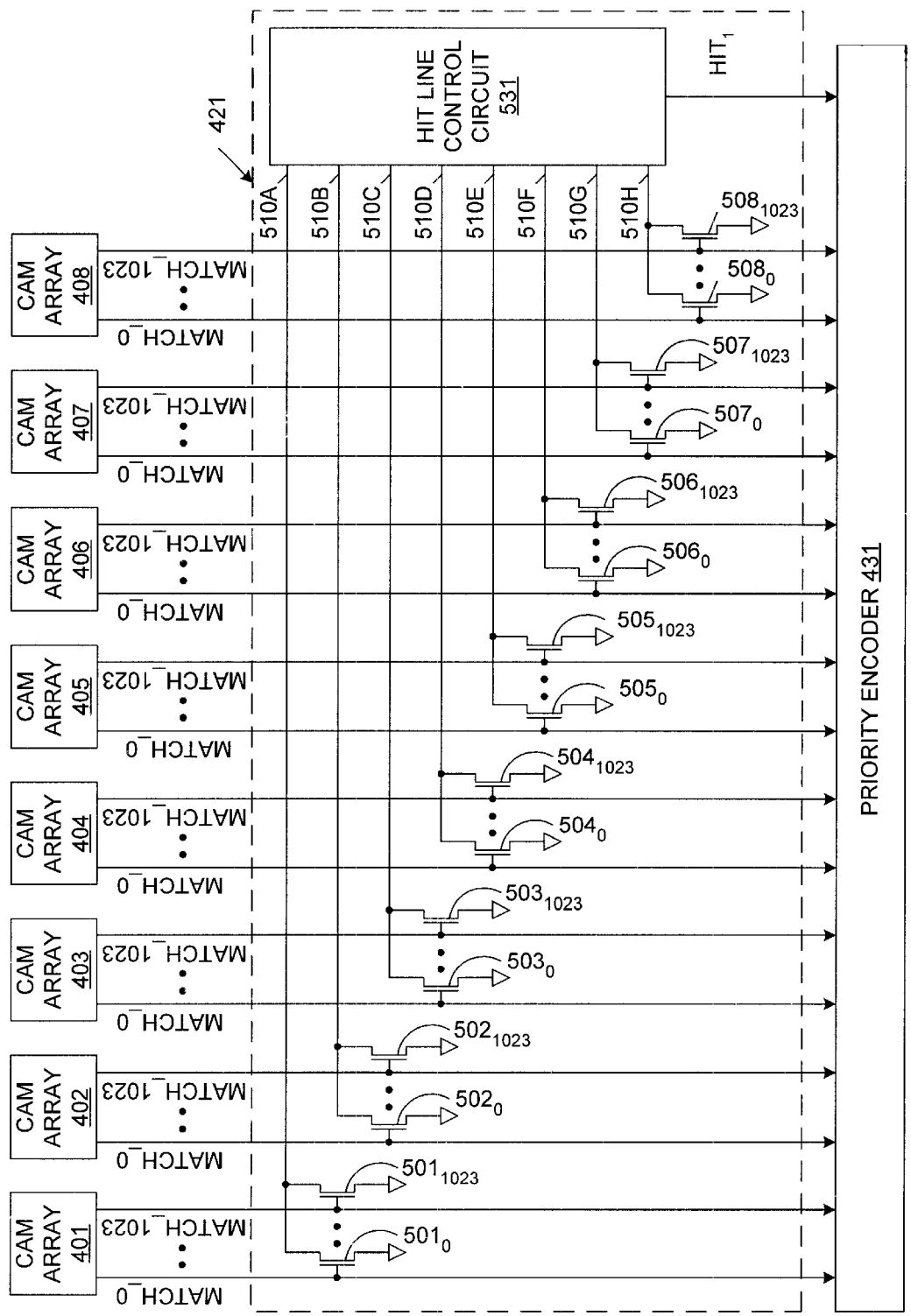
FIG. 5B is a schematic diagram illustrating a match detector in accordance with another embodiment of the present invention.

FIG. 5B is a schematic diagram illustrating first match detector 421 in accordance with another embodiment of the present invention. In the embodiment of FIG. 5B, hit line 510 is divided into eight separate hit lines 510A–510H. Each of hit lines 510A–510H is coupled to a corresponding set of 1024 pass transistors. More specifically, hit lines 510A, 510B, 510C, 510D, 510E, 510F, 510G and 510H are coupled to pass transistors, $501_0$–$501_{1023}$, $502_0$–$502_{1023}$, $503_0$–$503_{1023}$, $504_0$–$504_{1023}$, $505_0$–$505_{1023}$, $506_0$–$506_{1023}$, $507_0$–$507_{1023}$ and $508_0$–$508_{1023}$, respectively. Each of hit lines 510A–510H is pre-charged high at the beginning of the first memory cycle. If any one of hit lines 510A–510H is pulled down to a logic low level (i.e., at least one match exists), then hit line control circuit 531 asserts a logic high $HIT_1$ signal. If none of hit lines 510A–510H is pulled down to a logic low level (i.e., no match exists), then hit line control circuit 531 provides a logic low $HIT_1$ signal. The embodiment illustrated in FIG. 5B advantageously reduces the number of pass transistors coupled to a given hit line. It is understood that in other embodiments, other numbers of hit lines can be used.

The $HIT_1$ signal is provided to first priority encoder 431. First priority encoder 431 is enabled in response to a logic high $HIT_1$ signal. Thus, first priority encoder 431 is enabled if at least one match occurs in the first set of CAM arrays 401–408. Conversely, first priority encoder 431 is disabled in response to a logic low $HIT_1$ signal. Thus, first priority encoder 431 is disabled if no match occurs in the first set of CAM arrays 401–408.

If enabled, first priority encoder 431 determines which one of the asserted match control signals has the highest priority, and generates an address A1[13:0] representative of this match control signal. Address A1[13:0] is routed through output multiplexer 423 as output address A[13:0] in response to the logic high $HIT_1$ signal provided by first match detector 421. After the output address A[13:0] is provided, the comparison operation is complete. Consequently, if a match exists in the first set of CAM arrays 401–408, then the comparison operation is completed in one memory cycle. Note that if a match exists in the first set of CAM arrays 401–408, it is not necessary to determine whether or not a match exists in the second set of CAM arrays 409–416, because any match in the second set of CAM arrays 409–416 will have a lower priority. Consequently, if a match exists in the first set of CAM arrays 401–408, then the second set of CAM arrays 409–416 and the second priority encoder 432 are not enabled during the comparison operation. Because CAM arrays 409–416 and priority encoder 432 are not enabled, these elements do not consume power during the comparison operation. Consequently, power consumption within CAM system 400 is reduced by half if a match exists in the first set of CAM arrays 401–408.

If no match is detected in the first set of CAM arrays 401–408 during the first memory cycle, then the $HIT_1$ signal is de-asserted low in the manner described above. The logic low $HIT_1$ signal disables first priority encoder 431 and initiates a second memory cycle. Because first priority encoder 431 is not enabled if there is no match detected in the first set of CAM arrays 401–408, additional power savings are realized.

The second memory cycle is initiated (if necessary) by opening switch 441 and closing switch 442. As a result, input data value D[63:0] is provided to the second set of CAM arrays 409–416. The match control signals provided by the second set of CAM arrays 409–416 are provided to second match detector 422 and second priority encoder 432. In the described embodiment, second match detector 422 is identical to first match detector 421, and second priority encoder 432 is identical to first priority encoder 431. Thus, if a match is detected in the second set of CAM arrays 409–416, then second match detector 422 asserts a logic high $HIT_2$ signal which enables second priority encoder 432. Once enabled, second priority encoder 432 identifies the asserted match control signal having the highest priority and generates an address A2[13:0] corresponding to this match control signal. This address A2[13:0] is routed through output multiplexer 423 as output address A[13:0] in response to the logic high $HIT_2$ signal.

If a match exists in the second set of CAM arrays 409–416, then the comparison access of CAM system 400 has a duration of two memory cycles. However, the power consumption within CAM system 400 is reduced by 25 percent in this case because first priority encoder 431 is not enabled.

If a match does not exist in the second set of CAM arrays 409–416 during the second memory cycle, then second match detector 422 provides a logic low $HIT_2$ signal, which disables second priority encoder 432. Under these conditions, output multiplexer 423 is disabled, such that no output address A[13:0] is provided. In this case, neither first priority encoder 431 nor second priority encoder 432 is enabled, thereby reducing power consumption by about 50 percent.

As described above, CAM system 400 has a first set of CAM arrays 401–408 with a corresponding first priority encoder 431, and a second set of CAM arrays 409–416 with a corresponding second priority encoder 432. However, as described below, other CAM systems in accordance with the present invention can have other groupings of CAM array sets and priority encoders.

Figure 6:
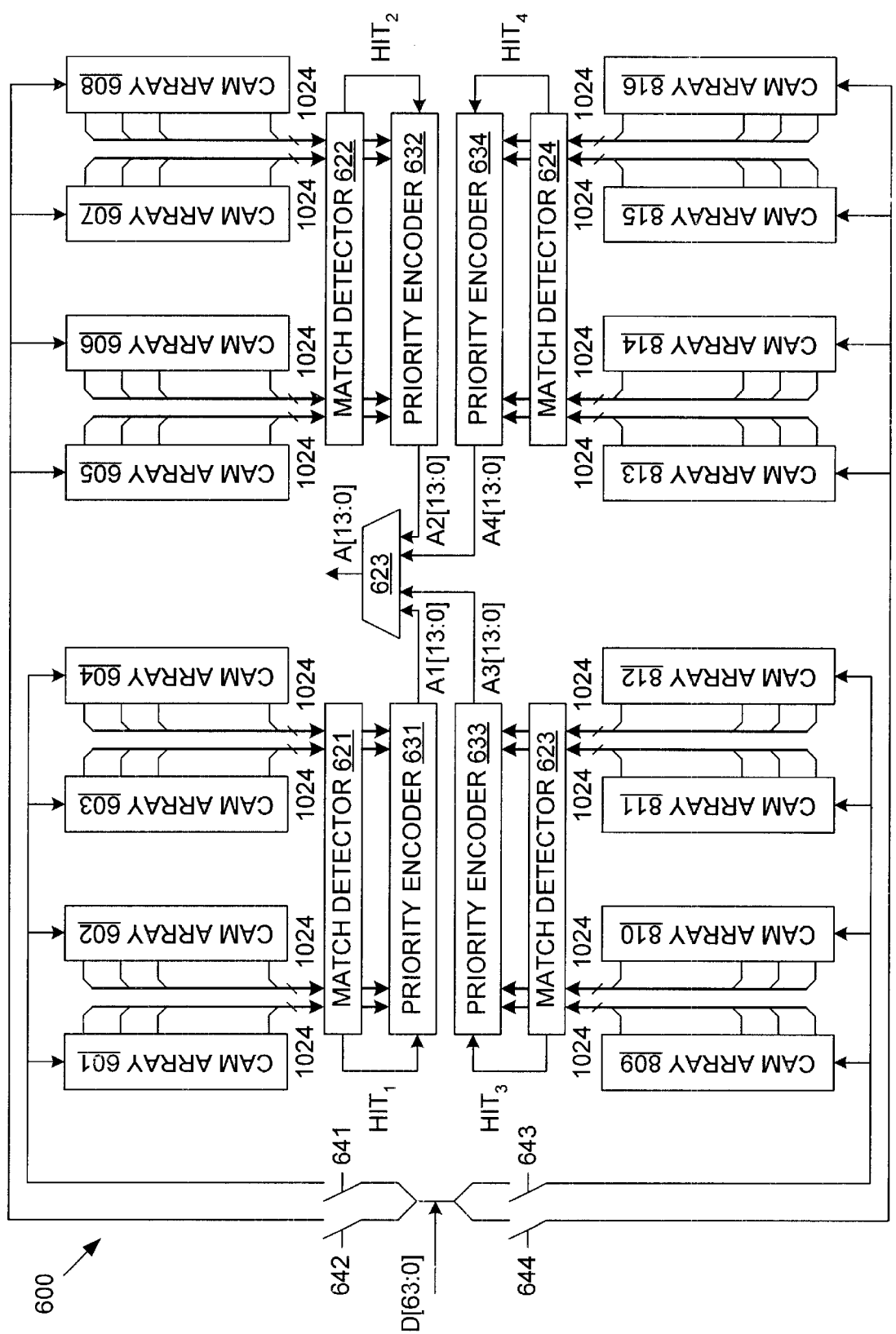
FIGS. 6, 7 and 8 are block diagrams of 1-Mbit CAM systems in accordance with three other embodiments of the present invention.

FIG. 6 is a block diagram of CAM system 600, which includes four sets of CAM arrays 601–604, 605–608, 609–612 and 613–616 and four corresponding priority encoders 631, 632, 633 and 634. Each of priority encoders 631–634 has a corresponding match detector circuit 621–624. In the described embodiment, CAM arrays 601–616 are identical to CAM arrays 401–416 (FIG. 4). The first set of CAM arrays 601–604 is selected to have the highest priority, followed by the second set of CAM arrays 605–608 (second highest priority), the third set of CAM arrays 609–612 (third highest priority) and the fourth set of CAM arrays 613–616 (lowest priority).

During a first memory cycle, switch 641 is closed and switches 642–644 are opened, thereby providing input data value D[63:0] to the first set of CAM arrays 601–604. First match detector 621 processes the match control signals generated by the first set of CAM arrays 601–604 in the same manner as first match detector 421 (FIGS. 5A, 5B). Thus, if a match exists in the first set of CAM arrays 601–604, first match detector 621 asserts the $HIT_1$ signal, thereby enabling first priority encoder 631 and causing output multiplexer 623 to route the address A1[13:0] (which is provided by first priority encoder 631) as output address A[13:0]. CAM arrays 605–616 and priority encoders 632–634 are not enabled during the first memory cycle. As a result, power consumption is reduced by 75 percent if a match is detected in the first memory cycle.

If no match exists in the first set of CAM arrays 601–604, the processing continues during a second memory cycle. During the second memory cycle, switch 642 is closed and switches 641 and 643–644 are opened, thereby providing the input data value D[63:0] to the second set of CAM arrays 605–608. If a match exists in the second set of CAM arrays 605–608, then second priority encoder 632 asserts the $HIT_2$ signal, thereby enabling second priority encoder 632 and causing output multiplexer 623 to route the address A2[13:0] (which is provided by second priority encoder 632) as output address A[13:0]. If a match exists in the second set of CAM arrays 605–608 (and no match exists in the first set of CAM arrays 601–604), then first set of CAM arrays 601–604, the second set of CAM arrays 605–608, and the second priority encoder 632 are enabled during the comparison operation. Note that CAM arrays 609–616 and priority encoders 631 and 633–634 are not enabled under these conditions, and thereby do not contribute to power consumption within CAM system 600. In this case, the comparison operation is completed in two memory cycles.

If no match exists in the first set of CAM arrays 601–604 or the second set of CAM arrays 605–608, then processing continues during a third memory cycle. During the third memory cycle, switch 643 is closed and switches 641–642 and 644 are opened, thereby providing the input data value D[63:0] to the third set of CAM arrays 609–612. If a match exists in the third set of CAM arrays 609–612, then third priority encoder 633 asserts the $HIT_3$ signal, thereby enabling third priority encoder 633 and causing output multiplexer 623 to route the address A3[13:0] (which is provided by third priority encoder 633) as output address A[13:0]. If a match exists in the third set of CAM arrays 609–612 (and no match exists in the first set of CAM arrays 601–604 or the second set of CAM arrays 605–608), then the first, second and third sets of CAM arrays 601–612, and the third priority encoder 633 are enabled during the comparison operation. Note that CAM arrays 613–616 and priority encoders 631–632 and 634 are not enabled under these conditions, and thereby do not contribute to power consumption within CAM system 600. In this case, the comparison operation is completed in three memory cycles.

Finally, if no match exists in the first set of CAM arrays 601–604, the second set of CAM arrays 605–608 or the third set of CAM arrays 609–612, then processing continues during a fourth memory cycle. During the fourth memory cycle, switch 644 is closed and switches 641–643 are opened, thereby providing the input data value D[63:0] to the fourth set of CAM arrays 613–616. If a match exists in the fourth set of CAM arrays 613–616, then fourth priority encoder 634 asserts the $HIT_4$ signal, thereby enabling fourth priority encoder 634 and causing output multiplexer 623 to route the address A4[13:0] (which is provided by fourth priority encoder 634) as output address A[13:0]. If a match exists in the fourth set of CAM arrays 613–616 (and no match exists in the first, second or third set of CAM arrays 601–612), then all four sets of CAM arrays 601–616, and the fourth priority encoder 634 are enabled during the comparison operation. Note that priority encoders 631–633 are not enabled under these conditions, and thereby do not contribute to power consumption within CAM system 600. In this case, the comparison operation is completed in four memory cycles.

Although CAM system 400 and CAM system 600 each has a number of sets of CAM arrays that is equal to the number of priority encoders, this is not necessary. For example, more than one priority encoder can be provided for each set of CAM arrays.

Figure 7:
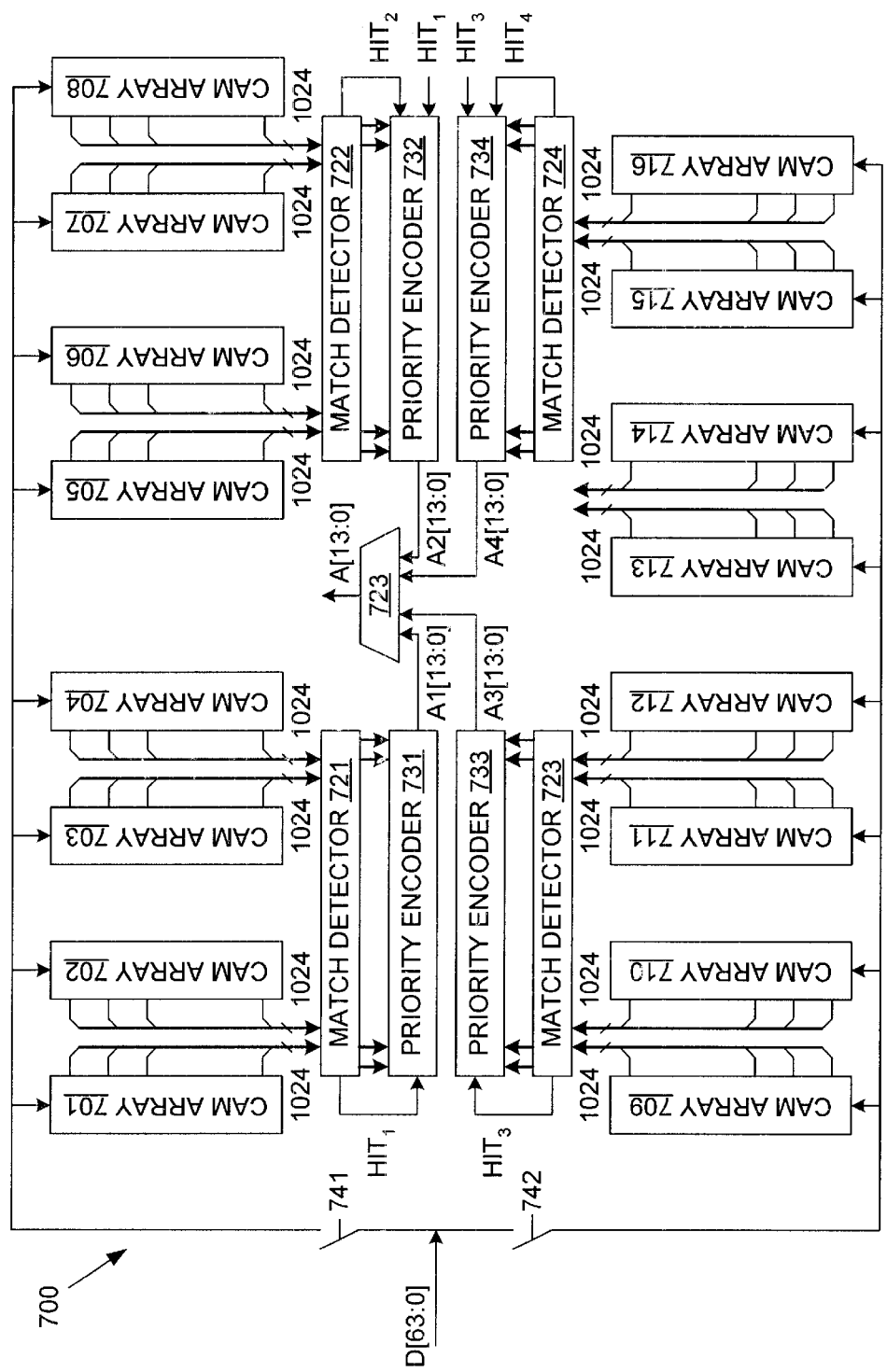

FIG. 7 is a block diagram of a CAM system 700 having a first set of CAM arrays 701–708 and a second set of CAM arrays 709–716. The first set of CAM arrays 701–708 is selected to have a higher priority than the second set of CAM arrays 709–716. In the described embodiment, CAM arrays 701–716 are identical to CAM arrays 401–416 (FIG. 4). The first set of CAM arrays 701–708 is coupled to a first priority encoder 731 and a second priority encoder 732 (by a first match detector 721 and a second match detector 722, respectively). Similarly, the second set of CAM arrays 709–716 is coupled to a third priority encoder 733 and a fourth priority encoder 734 (by a third match detector 723 and a fourth match detector 724, respectively). In the described embodiment, priority encoders 731–734 are identical to priority encoders 631–634 (FIG. 6), and match detectors 721–724 are identical to priority encoders 621–624 (FIG. 6).

CAM system 700 operates as follows. During a first memory cycle, switch 741 is closed and switch 742 is opened, thereby providing input data value D[63:0] to the first set of CAM arrays 701–708. First match detector 721 and second match detector 722 operate in parallel to determine if any match conditions exist. If first match detector 721 detects a match, then first match detector 721 asserts a $HIT_1$ signal. This $HIT_1$ signal is used to enable first priority encoder 731 and disable second priority encoder 732. The asserted $HIT_1$ signal is also used to cause output multiplexer 723 to route the address A1[13:0] provided by first priority encoder 731 as output address A[13:0]. If second match detector 722 detects a match, then second match detector 722 asserts a $HIT_2$ signal. If the $HIT_1$ signal is not asserted, then an asserted $HIT_2$ will enable second priority encoder 732. Under these conditions, the asserted $HIT_2$ signal is also used to cause output multiplexer 723 to route the address A2[13:0] provided by second priority encoder 732 as output address A[13:0]. Consequently, if a match exists in the first set of CAM arrays 701–708, then only one of the first and second priority encoders 731–732 is enabled. This saves power within priority encoders 731–732.

If a match does not exist in the first set of CAM arrays 701–708, then a second memory cycle is initiated by closing switch 742 and opening switch 741, thereby providing the input data value D[63:0] to the second set of CAM arrays 709–716. The above-described process is then repeated with third match detector 723, fourth match detector 724, third priority encoder 733 and fourth priority encoder 734.

In another embodiment of the present invention, the match detectors can be inserted between various layers of the priority encoders.

Figure 8:
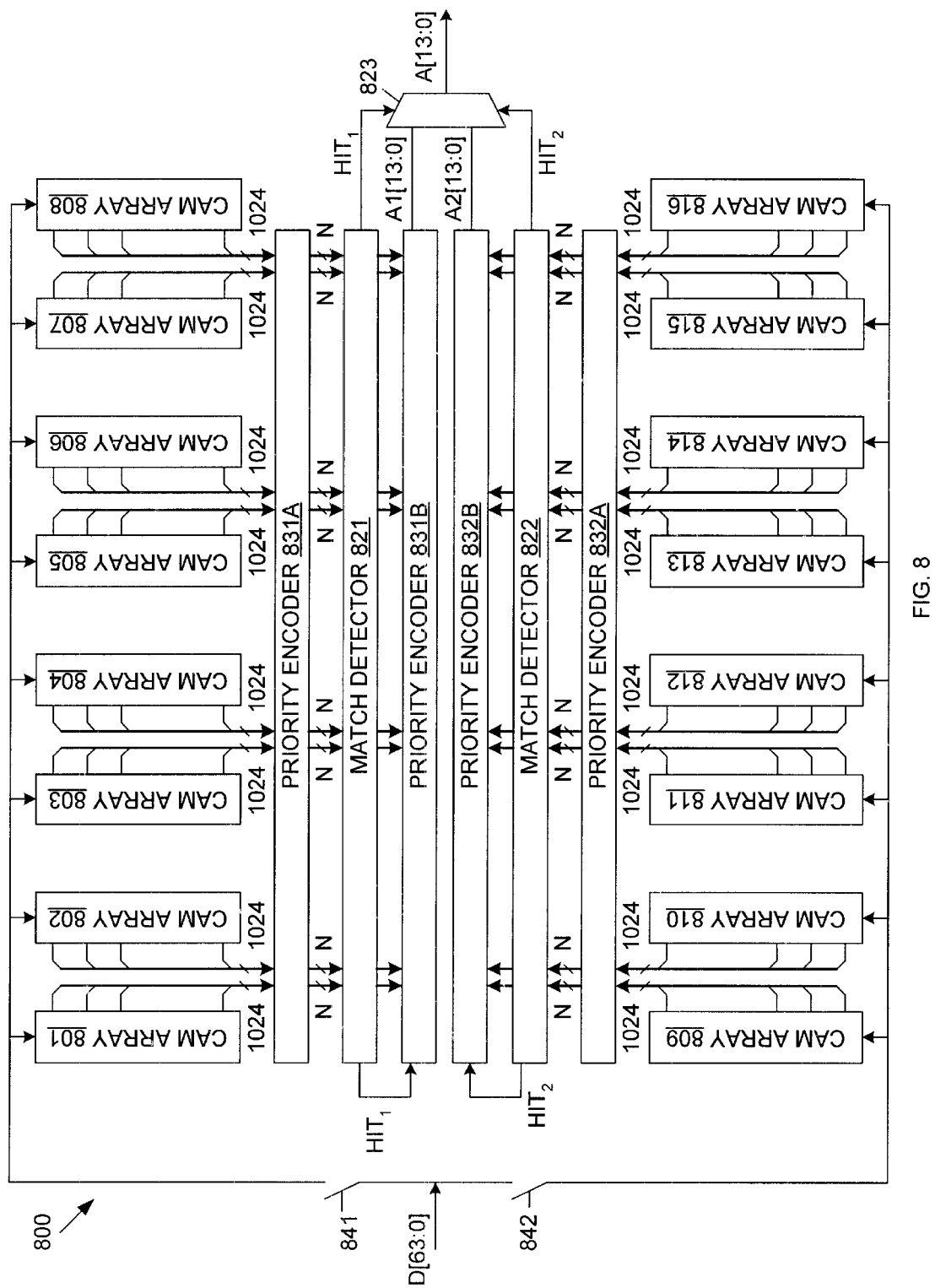

FIG. 8 is a block diagram of a CAM system 800 that implements multi-level priority encoders in accordance with another embodiment of the invention. CAM system 800 includes CAM arrays 801–816, which are identical to CAM arrays 401–416 (FIG. 4), first-level priority encoders 831A and 832A, second-level priority encoders 831B and 832B, match detectors 821 and 822, output multiplexer 823, and switches 841–842. The first set of CAM arrays 801–808 is selected to have a higher priority than the second set of CAM arrays 809–816.

During a first memory cycle, switch 841 is closed and switch 842 is opened, thereby providing input data value D[63:0] to the first set of CAM arrays 801–808. The first set of CAM arrays 801–808 is coupled to provide match control signals to first-level priority encoder 831A. First-level priority encoder 831A reduces the 8 sets of 1024 match control signals down to 8 sets of N match control signals, where N is less than 1024. That is, first-level priority encoder 831A partially processes all of the match control signals received from the first set of CAM arrays 801–808. In various embodiments, N may be equal to 256 or 64, for example.

First match detector 821 receives the 8×N match control signals from first-level priority encoder 831A. In the described embodiment, first match detector 821 is similar to match detector 421 (FIGS. 5A, 5B). Thus, first match detector 821 asserts control signal $HIT_1$ upon detecting the presence of a match (e.g., the presence of an asserted match control signal).

If the $HIT_1$ signal is asserted, then second-level priority encoder 831B is enabled to finish processing the 8×N match control signals provided by first-level priority encoder 831A. At the end of this processing, second-level priority encoder 831B provides an address A1[13:0] to multiplexer 823. Multiplexer 823 routes this address A1[13:0] as output address A[13:0] in response to the asserted $HIT_1$ signal. If the $HIT_1$ signal is not asserted, then second-level priority encoder 831B is not enabled, and a second memory cycle is initiated.

During the second memory cycle, switch 842 is closed and switch 841 is opened. First-level priority encoder 832A, second match detector 822 and second-level priority encoder 832B process the match control signals provided by the second set of CAM arrays 809–816 in the manner described above during the second memory cycle.

CAM system 800 has the advantage of monitoring a reduced number of match control signals in order to determine whether a match exists. However, because first-level priority encoder 831A is always used during a comparison operation, the power savings realized by CAM system 800 are typically not as large as for above-described CAM systems 400, 600 and 700.

Figure 9:
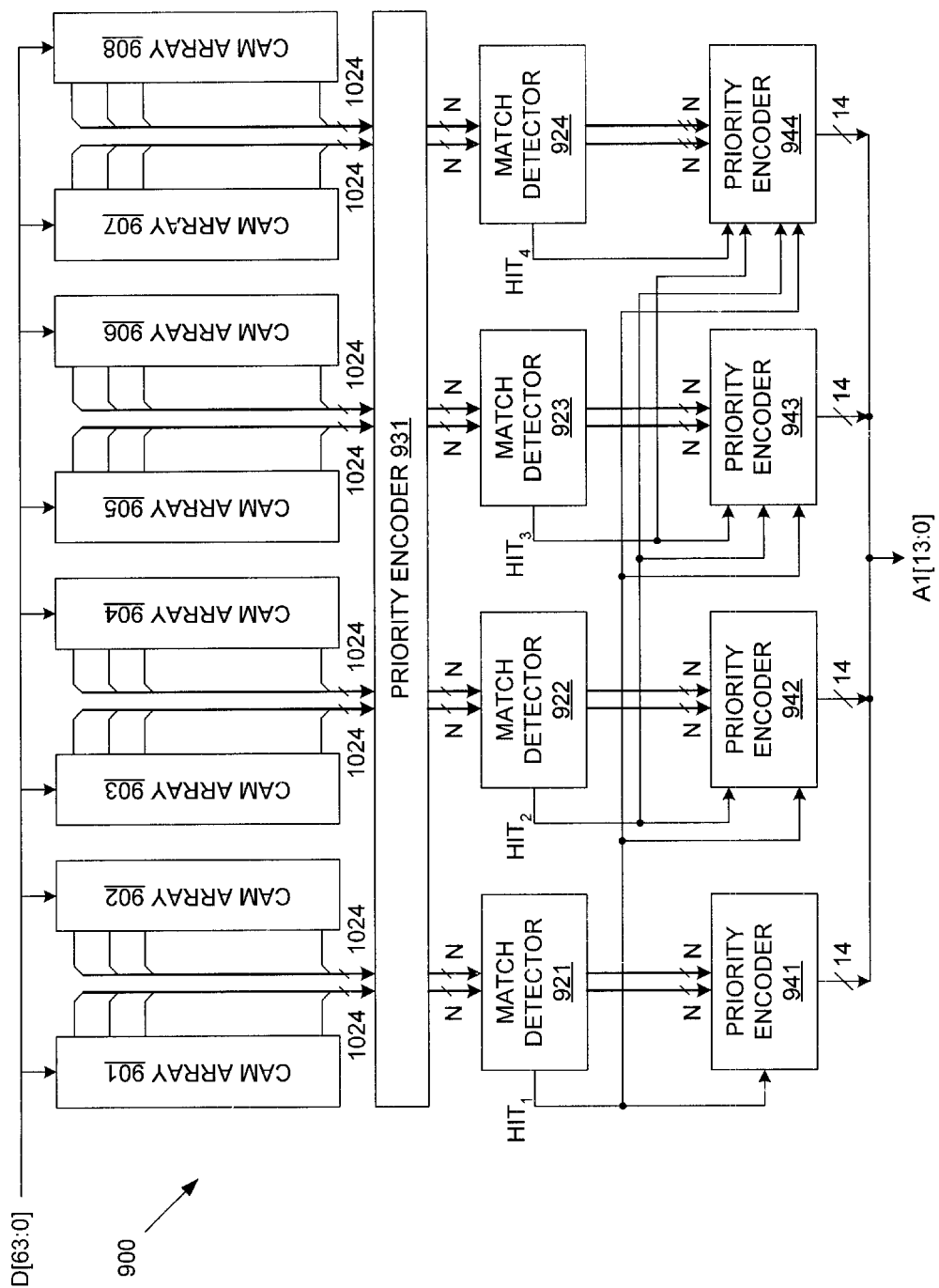
FIGS. 9 and 10 are block diagrams of half of 1-Mbit CAM systems in accordance with two other embodiments of the present invention.

In another embodiment of the present invention, each second-level priority encoder is divided into a plurality of parallel priority encoders. FIG. 9 is a block diagram of a CAM system 900 in accordance with this embodiment of the invention. For purposes of clarity, FIG. 9 only illustrates the portion of CAM system 900 associated with a first set of CAM arrays 901–908 (i.e., a corresponding second set of CAM arrays exists, but is not illustrated). The illustrated portion of CAM system 900 includes CAM arrays 901–908, which are identical to CAM arrays 401–408 (FIG. 4), first-level priority encoder 931, match detector circuits 921–924, and second-level priority encoders 941–944. First-level priority encoder 931 is identical to first level priority encoder 831A (FIG. 8). Within the first set of CAM arrays 901–908, CAM array pair 901–902 is selected to have the highest priority, CAM array pair 903–904 is selected to have the second highest priority, CAM array pair 905–906 is selected to have the third highest priority, and CAM array pair 907–908 is selected to have the lowest priority.

During a first memory cycle, input data value D[63:0] is provided to the first set of CAM arrays 901–908. The first set of CAM arrays 901–908 provides a plurality of match control signals to first-level priority encoder 931. First-level priority encoder 931 reduces the 8 sets of 1024 match control signals down to 8 sets of N match control signals, where N is less than 1024. For example, N may be equal to 256 or 64. Thus, first-level priority encoder 931 partially processes all of the match control signals received from the first set of CAM arrays 901–908.

The match control signals provided to match detectors 921, 922, 923 and 924 correspond with the match control signals provided by CAM array pairs 901–902, 903–904, 905–906 and 907–908, respectively. The construction of match detectors 921–924 is similar to the construction of the above-described match detector 421 (FIGS. 5A, 5B). Thus, match detectors 921, 922, 923 and 924 assert signals $HIT_1$, $HIT_2$, $HIT_3$ and $HIT_4$, respectively, upon detecting the presence of an asserted match control signal. The $HIT_1$–$HIT_4$ signals are provided to second-level priority encoders 941–944 as illustrated.

If the $HIT_1$ signal is asserted, indicating that a match exists in CAM array pair 901–902, then second-level priority encoder 941 is enabled and second-level priority encoders 942–944 are disabled.

If the $HIT_1$ signal is not asserted and the $HIT_2$ signal is asserted (indicating that a match exists in CAM array pair 903–904), then second-level priority encoder 942 is enabled and second-level priority encoders 941 and 943–944 are disabled.

If the $HIT_1$ and $HIT_2$ signals are not asserted, and the $HIT_3$ signal is asserted (indicating that a match exists in CAM array pair 905–906), then second-level priority encoder 943 is enabled and second-level priority encoders 941 and 943–944 are disabled.

If the $HIT_1$, $HIT_2$ and $HIT_3$ signals are not asserted and the $HIT_4$ signal is asserted (indicating that a match exists in CAM array pair 907–908), then second-level priority encoder 944 is enabled and second-level priority encoders 941–943 are disabled.

Finally, if none of the $HIT_1$–$HIT_4$ signals is asserted, then none of the second-level priority encoders 941–944 is enabled, and a second memory cycle is initiated. During the second memory cycle, similar processing is carried out for the second set of CAM arrays (not shown).

During the first memory cycle, the $HIT_1$–$HIT_4$ signals control an output multiplexer (not shown) to route the address A1[13:0] as an output address. In general, the output multiplexer will route the address A1[13:0] as the output address if any one of the $HIT_1$–$HIT_4$ signals is asserted.

CAM system 900 has the advantage of monitoring a reduced number of match control signals in order to determine whether a match exists. In addition, CAM system 900 provides power savings by only enabling the second-level priority encoder required to complete the comparison operation.

Figure 10:
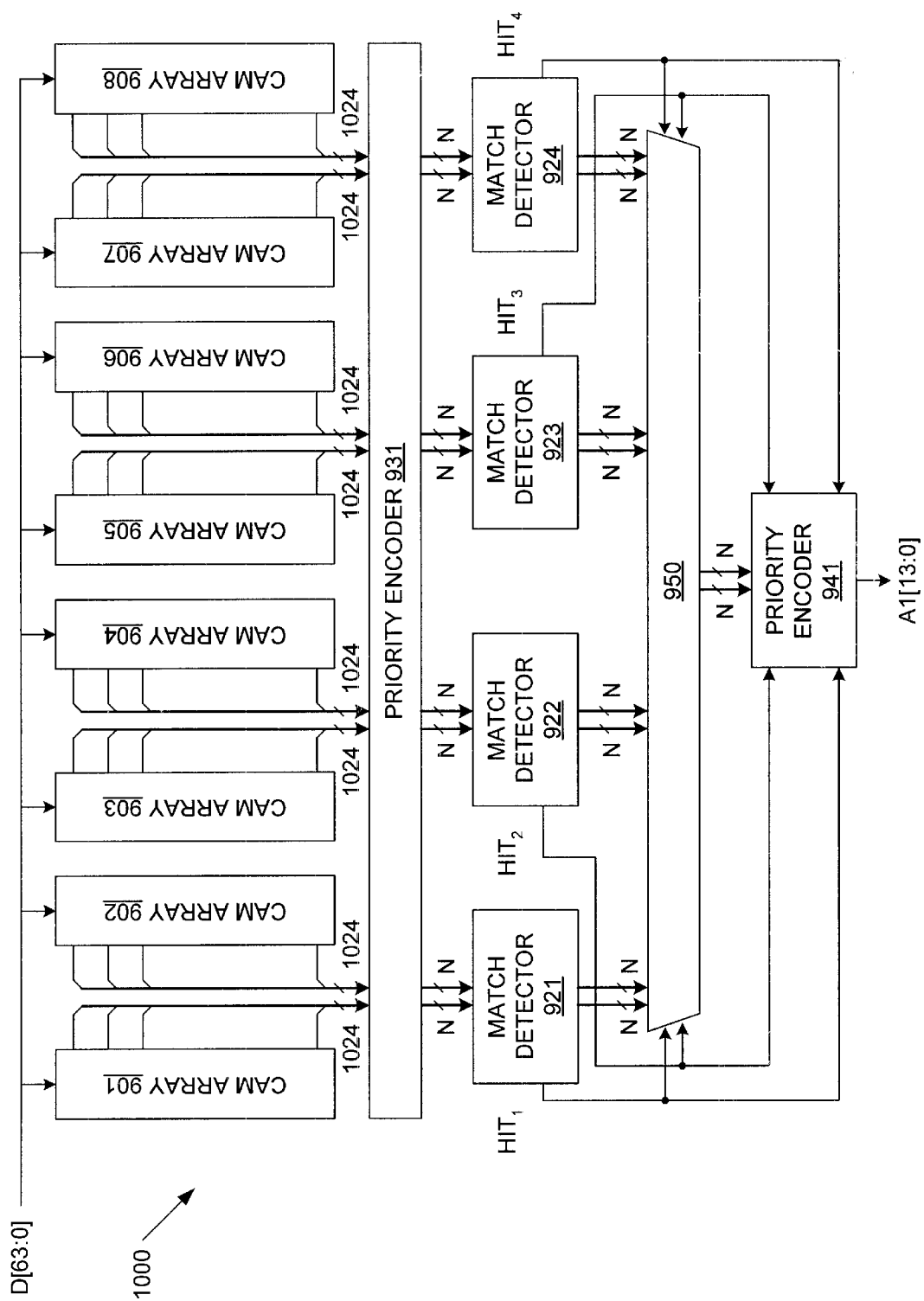

FIG. 10 is a block diagram of a CAM system 1000 that is a variation of CAM system 900. Similar elements in CAM systems 900 and 1000 are labeled with similar reference numbers. CAM system 1000 replaces the second-level priority encoders 942–944 of CAM system 900 with multiplexer 950. Multiplexer 950 is controlled to route the match control signals from one of match detectors 921–924 to second-level priority encoder 941. Multiplexer 950 is controlled by the $HIT_1$–$HIT_4$ signals. When the $HIT_1$ signal is asserted, multiplexer 950 routes the match control signals from match detector 921. When the $HIT_1$ signal is not asserted, and the $HIT_2$ signal is asserted, multiplexer 950 routes the match control signals from match detector 922. When the $HIT_1$ and $HIT_2$ signals are not asserted, and the $HIT_3$ signal is asserted, multiplexer 950 routes the match control signals from match detector 923. When the $HIT_1$, $HIT_2$ and $HIT_3$ signals are not asserted, and the $HIT_4$ signal is asserted, multiplexer 950 routes the match control signals from match detector 924. Priority encoder 941 is enabled if any one of the $HIT_1$–$HIT_4$ signals is asserted. If none of the $HIT_1$–$HIT_4$ signals is asserted, priority encoder 941 is disabled.

CAM system 1000 has the advantage of monitoring a reduced number of match control signals in order to determine whether a match exists. CAM system 1000 has the further advantage of having fewer second-level priority encoders than CAM system 900, thereby reducing the required layout area of CAM system 1000.

Although the present invention has been described in connection with several embodiments, it is understood that this invention is not limited to the embodiments disclosed, but is capable of various modifications which would be apparent to one of ordinary skill in the art. Thus, the invention is limited only by the following claims.

What is claimed is:

1. A content addressable memory (CAM) system comprising:
   a first CAM array configured to provide a first plurality of match control signals in response to an input data value during a first memory cycle;
   a first match detector configured to receive the first plurality of match control signals and assert a first hit control signal if any one of the first plurality of match control signals is asserted;
   a first priority encoder configured to receive the first plurality of match control signals and the first hit control signal, wherein the first priority encoder is only enabled to process the first plurality of match control signals if the first hit control signal is asserted;
   a second CAM array configured to provide a second plurality of match control signals in response to the input data value during a second memory cycle, only if the first hit control signal is not asserted during the first memory cycle, the first plurality of match control signals having a higher priority than the second plurality of match control signals;
   a second match detector configured to receive the second plurality of match control signals and assert a second hit control signal if any one of the second plurality of match control signals is asserted; and
   a second priority encoder configured to receive the second plurality of match control signals and the second hit control signal, wherein the second priority encoder is only enabled to process the second plurality of match control signals if the second hit control signal is asserted.

2. The CAM system of claim 1, further comprising an output multiplexer having input terminals coupled to receive address values from the first and second priority encoders, and control terminals coupled to receive the first and second hit control signals from the first and second match detectors.

3. The CAM system of claim 1, further comprising:
   a first switch for providing the input data value to the first CAM array during the first memory cycle; and
   a second switch for providing the input data value to the second CAM array during the second memory cycle.

4. The CAM system of claim 1, wherein the first CAM array is comprised of a first plurality of CAM arrays, and the second CAM array is comprised of a second plurality of CAM arrays.

5. A content addressable memory (CAM) system comprising:
   a first CAM array configured to provide a first plurality of match control signals having a first priority and a second plurality of match control signals having a second priority in response to an input data value, wherein the first priority is higher than the second priority;
   a first match detector configured to receive the first plurality of match control signals and assert a first hit control signal if any one of the first plurality of match control signals is asserted;
   a second match detector configured to receive the second plurality of match control signals, and assert a second hit control signal if any one of the second plurality of match control signals is asserted;
   a first priority encoder configured to receive the first plurality of match control signals and the first hit control signal, wherein the first priority encoder is only enabled to process the first plurality of match control signals if the first hit control signal is asserted; and
   a second priority encoder configured to receive the second plurality of match control signals, the first hit control signal, and the second hit control signal, wherein the second priority encoder is only enabled to process the second plurality of match control signals if the first hit control signal is not asserted and the second hit control signal is asserted.

6. The CAM system of claim 5, further comprising an output multiplexer having input terminals coupled to receive address values from the first and second priority encoders, and control terminals coupled to receive the first and second hit control signals from the first and second match detectors.

7. The CAM system of claim 5, wherein the first CAM array is comprised of a plurality of CAM arrays.

8. The CAM system of claim 5, further comprising:
   a second CAM array configured to provide a third plurality of match control signals having a third priority and a fourth plurality of match control signals having a fourth priority in response to the input data value, only if the first and second hit control signals are not asserted, wherein the third priority is higher than the fourth priority, but lower than the second priority;
   a third match detector configured to receive the third plurality of match control signals and assert a third hit control signal if any one of the third plurality of match control signals is asserted;

a fourth match detector configured to receive the fourth plurality of match control signals, and assert a fourth hit control signal if any one of the fourth plurality of match control signals is asserted;

a third priority encoder configured to receive the third plurality of match control signals and the third hit control signal, wherein the third priority encoder is only enabled to process the third plurality of match control signals if the third hit control signal is asserted; and a fourth priority encoder configured to receive the fourth plurality of match control signals, the third hit control signal, and the fourth hit control signal, wherein the fourth priority encoder is only enabled to process the fourth plurality of match control signals if the third hit control signal is not asserted and the fourth hit control signal is asserted.

9. The CAM system of claim 8, further comprising:

a first switch for providing the input data value to the first CAM array during a first memory cycle; and a second switch for providing the input data value to the second CAM array during a second memory cycle.

10. A content addressable memory (CAM) system comprising:

a first CAM array that provides a first plurality of match control signals in response to an input data value during a first memory cycle;

a first first-level priority encoder coupled to the first CAM array, wherein the first first-level priority encoder reduces the first plurality of match control signals to a second plurality of match control signals;

a first match detector coupled to receive the second plurality of match control signals and assert a first hit control signal if any one of the second plurality of match control signals is asserted; and a first second-level priority encoder coupled to receive the second plurality of match control signals and the first hit control signal, wherein the first second-level priority encoder is only enabled to process the second plurality of match control signals if the first hit control signal is asserted.

11. The CAM system of claim 10, further comprising:

a second CAM array that provides a third plurality of match control signals in response to the input data value during a second memory cycle, only if the first hit control signal is not asserted during the first memory cycle;

a second first-level priority encoder coupled to the second CAM array, wherein the second first-level priority encoder reduces the third plurality of match control signals to a fourth plurality of match control signals;

a second match detector coupled to receive the fourth plurality of match control signals and assert a second hit control signal if any one of the fourth plurality of match control signals is asserted; and a second second-level priority encoder coupled to receive the fourth plurality of match control signals and the second hit control signal, wherein the second second-level priority encoder is only enabled to process the fourth plurality of match control signals if the second hit control signal is asserted.

12. The CAM system of claim 11, further comprising an output multiplexer having input terminals coupled to receive address values from the first and second second-level priority encoders, and control terminals coupled to receive the first and second hit control signals from the first and second match detectors.

13. The CAM system of claim 11, further comprising:

a first switch for providing the input data value to the first CAM array during the first memory cycle; and a second switch for providing the input data value to the second CAM array during the second memory cycle.

14. The CAM system of claim 10, wherein the first CAM array is comprised of a plurality of CAM arrays.

15. A content addressable memory (CAM) system comprising:

a first CAM array that generates a first plurality of match control signals having a first priority and a second plurality of match control signals having a second priority, wherein the first priority is higher than the second priority;

a first-level priority encoder coupled to the first CAM array, wherein the first-level priority encoder reduces the first and second pluralities of match control signals to third and fourth pluralities of match control signals, respectively;

a first match detector coupled to receive the third plurality of match control signals and assert a first hit control signal if any one of the third plurality of match control signals is asserted;

a second match detector coupled to receive the fourth plurality of match control signals and assert a second hit control signal if any one of the fourth plurality of match control signals is asserted;

a first second-level priority encoder coupled to receive the third set of match control signals and the first hit control signal, wherein the first second-level priority encoder is only enabled to process the third plurality of match control signals if the first hit control signal is asserted; and a second second-level priority encoder coupled to receive the fourth set of match control signals, wherein the second second-level priority encoder is only enabled to process the fourth plurality of match control signals if the first hit control signal is not asserted and the second hit control signal is asserted.

16. A content addressable memory (CAM) system comprising:

a first CAM array that generates a first plurality of match control signals having a first priority and a second plurality of match control signals having a second priority, wherein the first priority is higher than the second priority;

a first first-level priority encoder coupled to the first CAM array, wherein the first first-level priority encoder reduces the first and second pluralities of match control signals to third and fourth pluralities of match control signals, respectively;

a first match detector coupled to receive the third plurality of match control signals and assert a first hit control signal if any one of the third plurality of match control signals is asserted;

a second match detector coupled to receive the fourth plurality of match control signals and assert a second hit control signal if any one of the fourth plurality of match control signals is asserted;

a multiplexer configured to pass either the third plurality of match control signals or the fourth plurality of match control signals in response to the first and second hit control signals; and a second-level priority encoder coupled to receive the plurality of match control signals passed by the multiplexer.

17. The CAM system of claim 16, wherein the multiplexer is configured to pass the third plurality of match control signals if the first hit control signal is asserted, and wherein the multiplexer is configured to pass the fourth plurality of match control signals if the first hit control signal is not asserted and the second hit control signal is asserted.

18. A method of operating a content addressable memory (CAM) system comprising the steps of:
providing a first CAM array and a second CAM array, wherein the first CAM array has a higher priority than the second CAM array;
providing an input data value to the first CAM array during a first memory cycle;
determining whether the input data value results in a match within the first CAM array during the first memory cycle;
enabling a first priority encoder if the input data value results in a match within the first CAM array during the first memory cycle;
disabling the first priority encoder and initiating a second memory cycle if the input data value does not result in a match within the first CAM array during the first memory cycle.

19. The method of claim 18, further comprising the steps of:
providing the input data value to the second CAM array during the second memory cycle;
determining whether the input data value results in a match within the second CAM array during the second memory cycle; and
enabling a second priority encoder if the input data value results in a match within the second CAM array during the second memory cycle.

20. The method of claim 19, further comprising the step of disabling the second priority encoder if the input data value does not result in a match within the second CAM array during the second memory cycle.

21. A method of operating a content addressable memory (CAM) system comprising the steps of:
providing a first CAM array and a second CAM array, wherein the first CAM array has a higher priority than the second CAM array;
providing an input data value to the first CAM array and the second CAM array during a first memory cycle;
determining whether the input data value results in a match within the first CAM array or the second CAM array during the first memory cycle;
enabling a first priority encoder and disabling a second priority encoder if the input data value results in a match within the first CAM array during the first memory cycle;
enabling the second priority encoder and disabling the first priority encoder if the input data value results in a match within the second CAM array, but does not result in a match in the first CAM array during the first memory cycle.

22. The method of claim 21, further comprising the steps of:
providing a third CAM array and a fourth CAM array, wherein the third CAM array has a higher priority than the fourth CAM array, but a lower priority than the second CAM array;
providing the input data value to the third CAM array and the fourth CAM array during a second memory cycle if no match is detected during the first memory cycle;
determining whether the input data value results in a match within the third CAM array or the fourth CAM array during the second memory cycle;
enabling a third priority encoder and disabling a fourth priority encoder if the input data value results in a match within the third CAM array during the second memory cycle;
enabling the fourth priority encoder and disabling the third priority encoder if the input data value results in a match within the fourth CAM array, but does not result in a match in the third CAM array during the second memory cycle.

23. A method of operating a content addressable memory (CAM) system comprising the steps of:
providing a first CAM array and a second CAM array, wherein the first CAM array has a higher priority than the second CAM array;
providing an input data value to the first CAM array during a first memory cycle;
generating a first plurality of match control signals in response to the input data value with the first CAM array during the first memory cycle;
reducing the first plurality of match control signals to a second plurality of match control signals with a first first-level priority encoder;
determining whether the input data value results in a match within the first CAM array during the first memory cycle by analyzing the second plurality of match control signals;
enabling a first second-level priority encoder if the input data value results in a match within the first CAM array during the first memory cycle; and
disabling the first second-level priority encoder if the input data value does not result in a match within the first CAM array during the first memory cycle.

24. The method of claim 23, further comprising the steps of:
initiating a second memory cycle if the input data value does not result in a match within the first CAM array during the first memory cycle;
providing the input data value to the second CAM array during the second memory cycle;
generating a third plurality of match control signals in response to the input data value with the second CAM array during the second memory cycle;
reducing the third plurality of match control signals to a fourth plurality of match control signals with a second first-level priority encoder during the second memory cycle;
determining whether the input data value results in a match within the second CAM array during the second memory cycle by analyzing the fourth plurality of match control signals; and
enabling a second second-level priority encoder if the input data value results in a match within the second CAM array during the second memory cycle.

25. The method of claim 24, further comprising the step of disabling the second second-level priority encoder if the input data value does not result in a match within the second CAM array during the second memory cycle.

26. A method of operating a content addressable memory (CAM) system comprising the steps of:

proviiding a first CAM array and a second CAM array, wherein the first CAM array has a higher priority than the second CAM array;

providing an input data value to the first CAM array and the second CAM array during a first memory cycle;

generating a first set of match control signals in response to the input data value with the first CAM array during the first memory cycle;

generating a second set of match control signals in response to the input data value with the second CAM array during the first memory cycle;

reducing the first set of match control signals to a third set of match control signals;

reducing the second set of match control signals to a fourth set of match control signals;

determining whether the input data value results in a match within the first CAM array during the first memory cycle by analyzing the third set of match control signals;

determining whether the input data value results in a match within the second CAM array during the first memory cycle by analyzing the fourth set of match control signals;

enabling a first second-level priority encoder and disabling a second second-level priority encoder if the input data value results in a match within the first CAM array during the first memory cycle; and enabling the second second-level priority encoder and disabling the first second-level priority encoder if the input data value results in a match within the second CAM array, but not the first CAM array, during the first memory cycle.

27. The method of claim 26, further comprising the step of disabling both the first and second second-level priority encoders and initiating a second memory cycle if the first input data value does not result in a match within either the first or second CAM array during the first memory cycle.

28. A method of operating a content addressable memory (CAM) system comprising the steps of:

providing a first CAM array and a second CAM array, wherein the first CAM array has a higher priority than the second CAM array;

providing an input data value to the first CAM array and the second CAM array during a first memory cycle;

generating a first set of match control signals in response to the input data value with the first CAM array during the first memory cycle;

generating a second set of match control signals in response to the input data value with the second CAM array during the first memory cycle;

reducing the first set of match control signals to a third set of match control signals;

reducing the second set-of match control signals to a fourth set of match control signals;

determining whether the input data value results in a match within the first CAM array during the first memory cycle by analyzing the third set of match control signals;

determining whether the input data value results in a match within the second CAM array during the first memory cycle by analyzing the fourth set of match control signals;

routing the third set of match control signals to a priority encoder if the input data value results in a match within the first CAM array; and routing the fourth set of match control signals to the priority encoder if the input data value results in a match within the second CAM array, but not within the first CAM array.

29. The method of claim 28, further comprising the step of disabling the priority encoder and initiating a second memory cycle if the first input data value does not result in a match within either the first or second CAM array during the first memory cycle.

* * * * *